United States Patent [19]
Raymond

[11] 3,943,439
[45] Mar. 9, 1976

[54] CAPACITOR TEST APPARATUS AND METHOD

[75] Inventor: Douglas W. Raymond, Berkeley, Calif.

[73] Assignee: Zehntel, Inc., Concord, Calif.

[22] Filed: Dec. 30, 1974

[21] Appl. No.: 537,253

[52] U.S. Cl. ............................................. 324/60 C
[51] Int. Cl.² ............................................. G01R 27/26
[58] Field of Search ...................... 324/60 C, 61 R

[56] References Cited
UNITED STATES PATENTS

| | | | |
|---|---|---|---|
| 3,325,727 | 6/1967 | Haas | 324/60 C |
| 3,370,229 | 2/1968 | Hamburger et al. | 324/60 C |

*Primary Examiner*—Stanley T. Krawczewicz
*Attorney, Agent, or Firm*—Flehr, Hohbach, Test, Albritton & Herbert

[57] ABSTRACT

A method and apparatus for the high-speed testing of capacitors. A computing amplifier is connected with the capacitor under test to form an integrator which integrates a known excitation signal. The integration is initiated with no charge stored by the capacitor and at a zero crossing of the excitation signal. The integration occurs over a period which produces the maximum voltage across the capacitor. A peak detector measures the maximum voltage across the capacitor to produce a peak detection voltage inversely proportional to the value of the capacitor and directly proportional to a predetermined nominal value of the capacitor. The reciprocal of the output from the peak detector is formed to provide a measurement directly proportional to the capacitor value and inversely proportional to the nominal value of the capacitor.

14 Claims, 4 Drawing Figures

FIG.—1

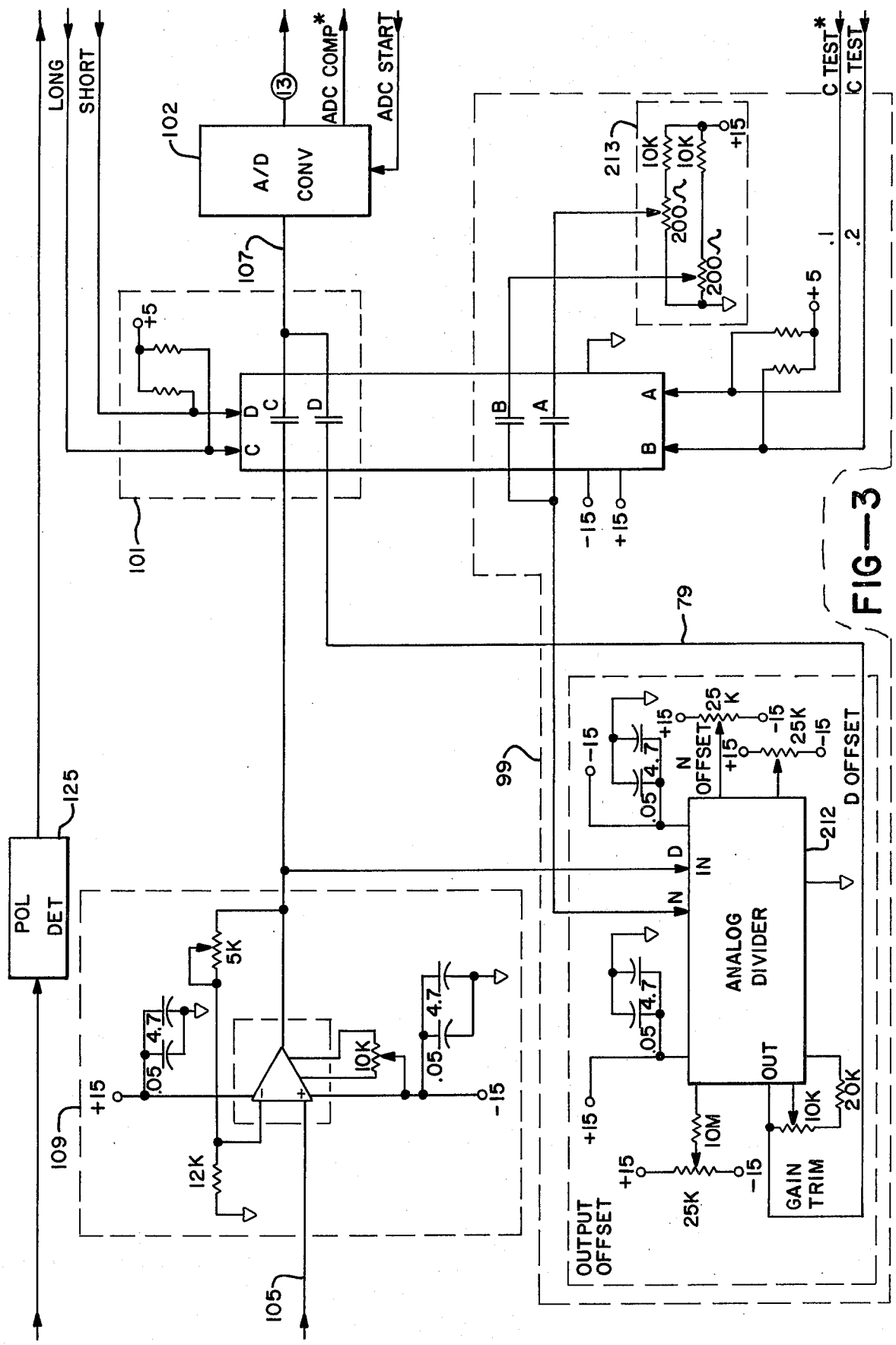

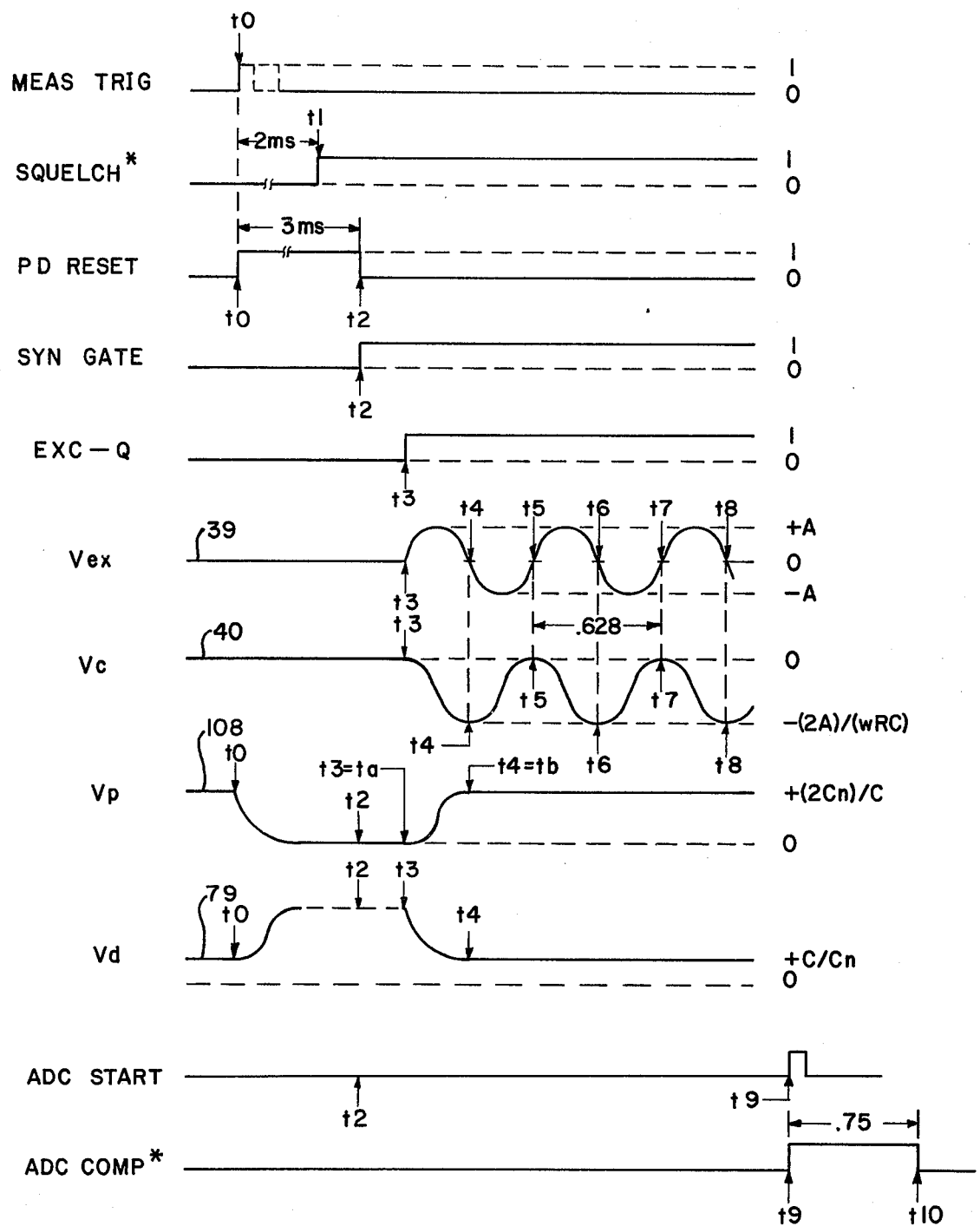
FIG.—4

3,943,439

CAPACITOR TEST APPARATUS AND METHOD

CROSS-REFERENCE TO RELATED APPLICATION

PROGRAMMABLE TESTER invented by RONALD N. BORRELLI and DOUGLAS W. RAYMOND, Ser. No. 537,563, filed Dec. 30, 1974, and assigned to ZEHNTEL, INCORPORATED.

BACKGROUND OF THE INVENTION

The present invention related to methods and apparatus for measuring capacitances.

While many techniques are know for measuring capacitances, the known techniques are not completely satisfactory for performing high-speed measurements in an economical manner. The ability to make high-speed capacitance measurements is particularly important in the field of automatic testing. in automatic testing, programmable circuit testers are employed to perform many tests. Both circuits and components within circuits are tested. The speed with which each test can be performed is, of course, important in determining the overall speed and efficiency of the automatic tester.

There is a need for improved test methods and apparatus for the high-speed testing of capacitors and particularly for methods and apparatus which are useful in high-speed, automatic testing of capacitors.

SUMMARY OF THE INVENTION

The present invention is a method and apparatus for the high-speed measurement of capacitance.

An exciter circuit is provided for energizing a capacitor under test with a known magnitude AC excitation signal. The capacitor is connected with a computing amplifier to form a computing circuit. The output from the computingn circuit, produced in response to the excitation signal, is sensed by a peak detector. The output signal from peak detector is proportion to the value of the capacitor under test.

In one preferred embodiment of the present invention, the exciter circuit includes means for initiating the excitation signal at a zero crossing. In the computing circuit, the capacitor is connected between the input and the output of the computing amplifier in an integrating configuration. Under the conditions where the excitation signal commences at a zero crossing, the integrated output from the computing circuit is biased entirely on one side of the zero axis and is tangent to the zero axis. Accordingly, the peak detector measurement of the output from the computing amplifier is inversely proportional to the value of the capacitor under test.

Further, means are provided for selecting computing factors which define a nominal value for the capacitor under test. The computing factors include the amplitude of the excitation signal, the frequency of the excitation signal, the input resistance of the computing circuit, and a scaling factor related to the gross size of the capacitor under tests. With these scaling factors selected, the output from the peak detector is directly proportional to the nominal value of the capacitor under test and inversely proportional to the actual value of the capacitor under test.

In a further embodiment of the invention, the reciprocal of the output from the peak detector is formed in an analog divider circuit whereby the output signal is directly proportional to the value of the capacitor under test and inversely proportional to the nominal value of the capacitor under test.

An additional feature of the invention includes an analog-to-digital converter for converting the output signal to a digital value. The converter is initiated within approximately one cycle of the excitation signal so that a high-speed measurement of capacitance is performed.

In accordance with the above summary, the present invention achieves the objective of providing an improved method and apparatus for the high-speed measurement of capacitors where the capacitance measurement is available within approximately one cycle of an AC excitation signal.

Additional objects and features of the invention will appear from the following description in which the preferred embodiments of the invention have been set forth in detail in conjunction with the drawings.

BRIEF DESCRIPTION OF THE DRAWINGS

FIG. 3 depicts a schematic representation of a portion of the converter within FIG. 1 which includes a reciprocal and analog-to-digital converter.

FIG. 4 depicts wave forms representative of the operation of the FIG. 1 apparatus.

DETAILED DESCRIPTION

Figure 1:
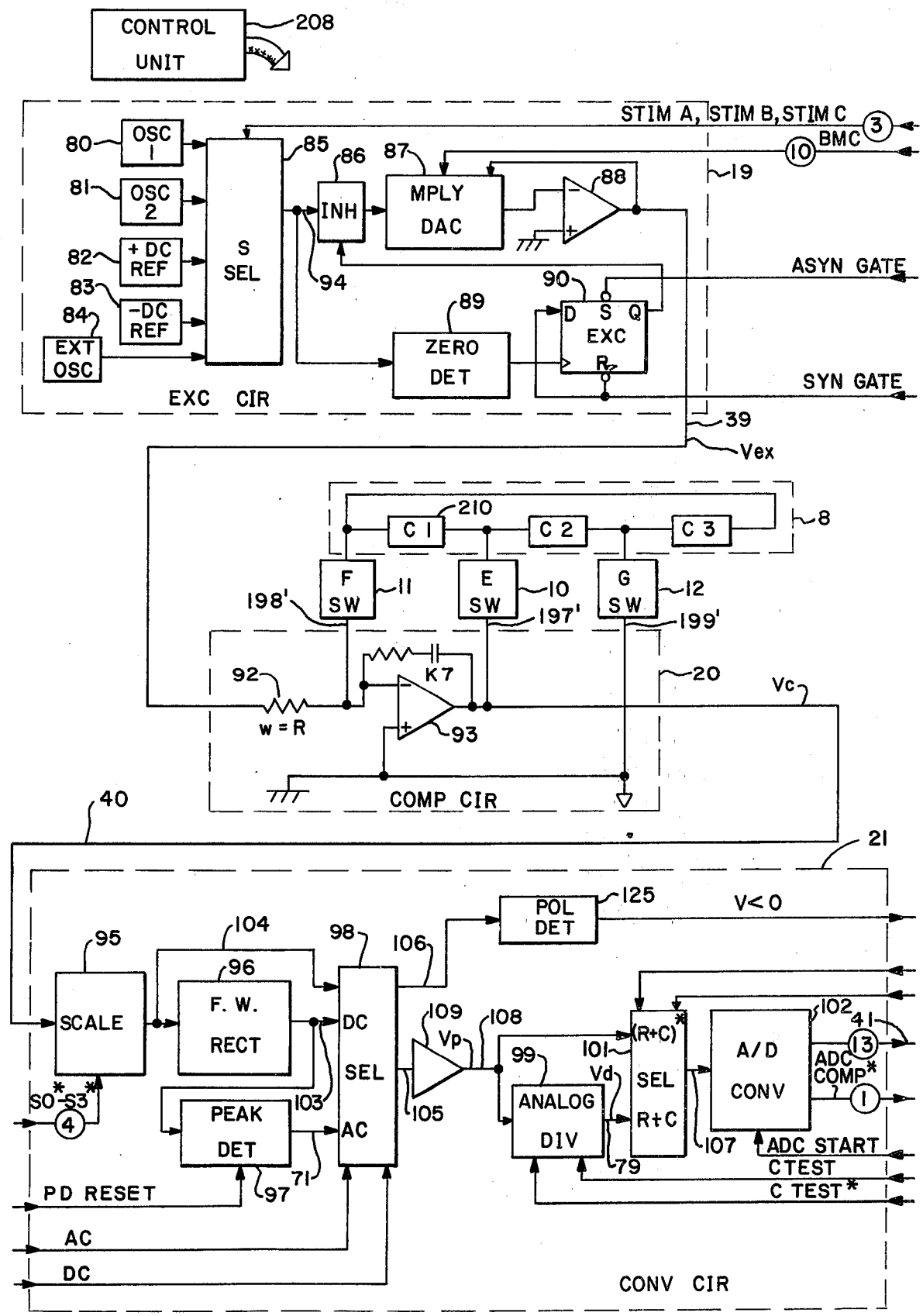
FIG. 1 depicts a schematic representation of an apparatus in accordance with the present invention.

In FIG. 1, a measurement unit is shown which includes an exciter circuit (EXC CIR) 19, a computing circuit (COMP CIR) 20 and a converter circuit (CONV CIR) 21. The computing circuit 20 is interconnected with the circuit under test 8 by means of device connection switches 10, 11, and 12. The C1 component 210 is the capacitor to be measured.

The excitation circuit 19, the computing circuit 20, and the converting circuit 21 are each controlled by a control unit 208. Control unit 208 in a preferred embodiment is the control circuitry disclosed and described in the above-identified cross-referenced application. Specifically, the control unit 208 corresponds to the processor 6 and the measurement unit controller 24 appearing generally in FIG. 1 of the cross-referenced application. The detailed description of processor 6 and the measurement unit controller 24 is described in connection with FIGS 1, 4 and FIG. 5 through FIG. 11 of the cross-referenced application and that description hereby incorporated by reference in the present application for purpose of teaching one preferred embodiment of a control unit for generating control signals useful in connection with the present invention.

In FIG. 1, the exciter circuit 19 includes a number of signal generators including a first oscillator (OSC 1) 80, a second oscillator (OSC 2) 81 and additional signal generators 82, 83, and 84. The oscillator 80 typically generates an AC signal having a voltage output, Vex, which equals $A \sin wt$. The second oscillator 81 typically generates an AC signal of the same form as the oscillator 80 but having a different frequency. Typically, the frequency of oscillator 80 is $10^3$ radians/sec (159.15 Hz) and the frequency of oscillator 81 is $10^4$ radians/sec (1591.5 Hz).

The signal source 80 through 84 are selected one at a time by the source selection circuit (S SEL) 85. Selection circuit 85 is a conventional multiplexor which provides on its output 94 one of the excitation signals under control of the 3-bit STIM A, STIM B, STIM C bus from the control unit 208 (see FIG. 9 of the cross-referenced applicaton).

The selected signal, in a typical embodiment described for the present application, is derived from oscillator 81. The output from oscillator 81 is input to the inhibit (INH) circuit 86 and to the zero detect (ZERO DET) circuit 89. Inhibit circuit 86 is a conventional gate or other switch which is controlled in the conduction stage by a 1 from the Q output of the excitation (EXC) flip-flop 90. For capacitance measurements of the present application, synchronous excitation is desired. For synchronous operation, control unit 208 (see FIG. 6 of the cross-referenced application) initially provides a 0 to the reset (R) and D inputs of flip-flop 90 on the SYN GATE line. The SYN GATE signal resets flip-flop 90 with a 0 on its Q output. Thereafter the SYN GATE signal goes to 1. When the zero detect circuit 89 detects a zero crossing of the signal on line 94, its output clocks flip-flop 90 to produce a 1 on its Q output. The 1 on the Q output of flip-flop 90 is received by the inhibit circuit 86 which responsively allows the signal on line 94 to be passed to the multiplying digital-to-analog converter (MPLY DAC) 87. Zero detector 89 is a conventional device for detecting the positive-going zero crossing of any AC signal on line 94.

When a signal is input from line 94 to the multiplier 87, multiplier 87 functions to multiply the magnitude of the input signal from circuit 86 by a program selected multiplication factor. The magnitude of the multiplication factor is controlled by the 10-bit binary BMC signal from the control unit 208 (see FIG. 6 of the cross-referenced application). The multiplier 87 is a conventional device which in a preferred embodiment is a 7520 DAC manufactured by Analog Devices Corporation. The output signal from the multiplier 87 is input to the voltage follower amplifier 88 to provide the desired excitation signal Vex on line 39 which in input to the computing circuit 20.

In FIG. 1, the computing circuit 20 is connected in the C mode for capacitance measurement (see the description of FIG. 13 in the cross-referenced application). In the C mode, the computing circuit 20 is connected in the form of an integrator. The input W resistor 92, having a value of R, connects directly to the negative input of the computing amplifier 93. The capacitor under test, the C1 component 210, having a capacitance value C to be measured, is connected between the input and the output of the computing amplifier 93 by program controllable switches 10 and 11. Switches 10 and 11 are utilized in a preferred embodiment, (see FIGS. 2 and 3 in the cross-referenced appliccation) to provide flexibility. Of course, the measurement method of the present invention can be employed without program controllable switches by directly connecting the capacitor 210 across amplifier 93.

The W resistor 92 is preferably one of the six program selectable resistors (see FIG. 4 of the cross-referenced application) although in the present application for clarity, it is shown as a single resistor with value of R.

In FIG. 1, the computing amplifier 93 also has connected between its input and output a shunting resistor of 100 ohms which is selectably connected by the relay contact K7. The function of the shunting resistor is to insure that there is no initial charge across the capacitor under test at the time that the computation is initiated. The contact K7 is closed until the SQUELCH* signal goes from 0 to 1. The contact K7 is opened and closed by a relay (not shown) in response to the SQUELCH* (see FIG. 4, the contact selection (K SEL) circuit 91 of the cross-referenced application).

The function of the computing circuit 20 is to receive the Vex signal equal to $A \sin \omega t$ on line 39 to produce an intergrated output signal, Vc, on line 40. The output Vc is the voltage across the C1 capacitor 210 as it appears on line 40. The integrated measurement signal on line 40 is input to the converter 21 where it is received by the scaler circuit 95. The scaler circuit 95 functions to invert and adjust the amplitude under command of the control unit 208 and its 4-bit SO*–S3* bus. The amplitude of scaler 95 is nominally a factor of 10 (0.1, 1, 10, 100) although in fact is slighly less in a preferred embodiment. The scaled measurement signal from scaler 95 is input to the fullwave rectifier (FW RECT) 96. In the present invention, rectifier 96 insures that all signals are greater than zero. Since the zero detector circuit 89 functions only to detect positive going transitions,, the output from the computing amplifier after inversion in scaler 95 always is greater than zero and hence in the present configuration the rectifier need not be employed. Its primary functiton is in connection with resistance measurements which are not the subject of the present application.

In the AC mode as occurs when a capacitance test is being made, the output from the rectifier 96 is input to the peak detector 97. The function of the peak detector 97, after being reset by the signal on the PD RESET line (see FIG. 10 of the cross-referenced application) is to provide a DC output level on line 71 equal to the highest peak input on line 103 from the rectifier 96.

In FIG. 1, the selection circuit 98 with a 1 for the AC signal from control unit 208 (see FIG. 10 of the cross-referenced application) connects the signal on line 71 as the peak detected output, Vp, on line 105 to the amplifier 109. The function of the amplifier 109 is to insure that the overall gain from line 40 to line 108 is some power of 10, specifically, 0.1, 1, 10, or 100.

The output signal on line 108 from amplifier 109 is input to the analog division circuit 99 which functions to form an output signal, Vd, which is the reciprocal times 2 of the signal Vp on line 108 whenever a C TEST signal from control unit 208 (see FIG. 9 of the cross-referenced application) signifies that a capacitance test is being performed. The reciprocal signal, Vd, on line 79 from divider 99 is selected by the SHORT signal from the control unit 208 (see FIG. 9 of the cross-referenced application) during a capacitance test for input to the analog-to-digital converter 102.

Converter 102 is a conventional device for converting the signal level on line 107 to a digitally encoded value on the BCD bus 41. Converter 102 is caused to commence a conversion by an ADC START signal from control unit 208 (see FIG. 10 of the cross-referenced application). An ADC COMP* signal occurs approximately 10 milliseconds after the ADC START signal to indicate when the conversion is complete.

Figure 2:
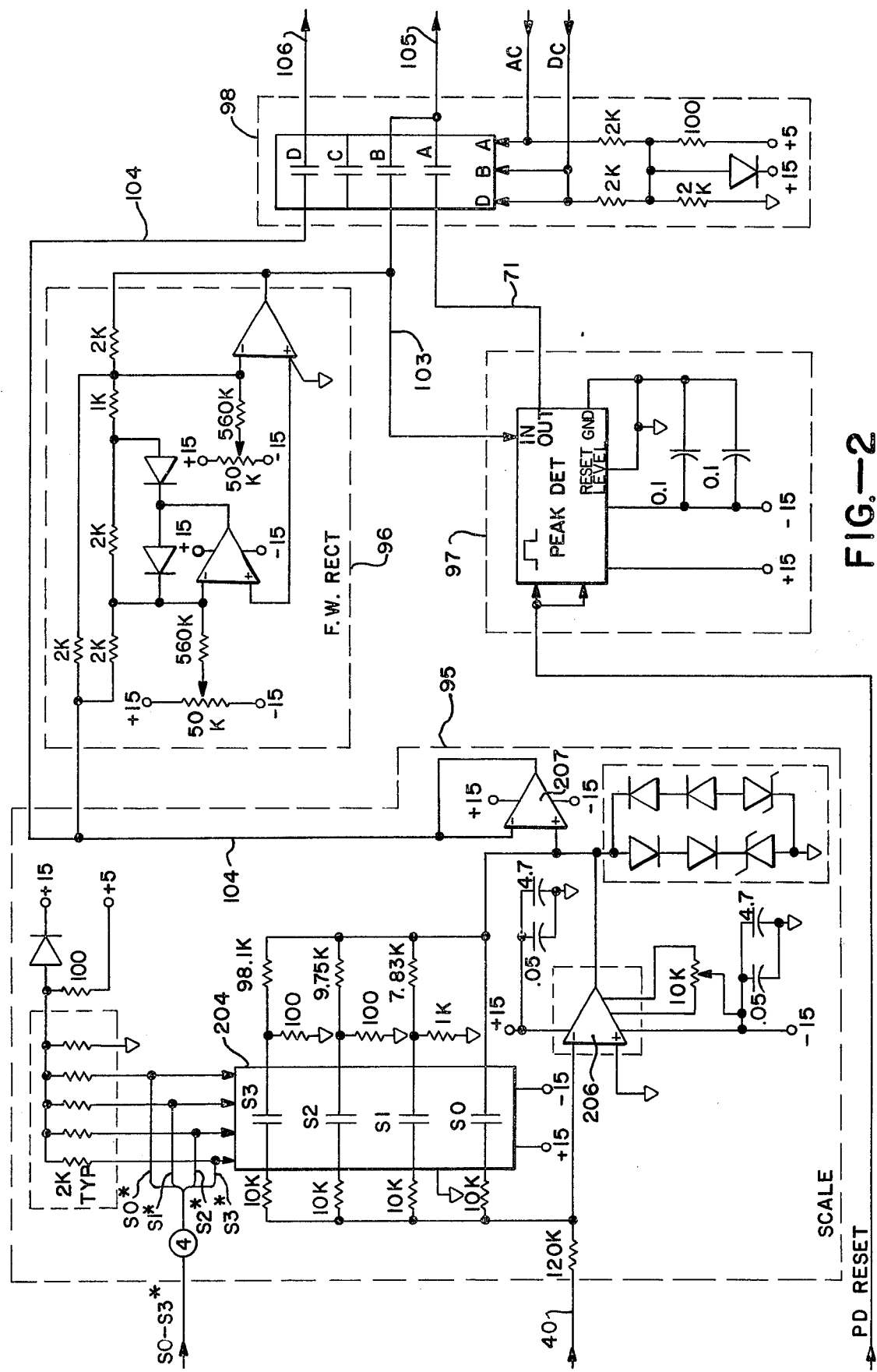
FIG. 2 depicts a schematic representation of a portion of the converter within FIG. 1 which includes a scaler and a peak detector.

In FIG. 2, the scaler 95, the full wave rectifier 96, the peak detector 97 and the selection circuit 98 of the converter 21 of FIG. 1 are shown. In the selection circuit 95, a conventional selector 204 selects one of four contacts S0, S1, S2 and S3 in response to the respective S0*, S1*, S2*, and S3* signals from the control unit 208 of FIG. 1. The control line S0* through S3* are appropriately tied through 2K resistors through a diode to +15 volts and through a 100 ohm resistor to +5 volts. Closure of one of the contacts S0 through S3 in selector 204 places a T-network of resistors in the feedback leg of the amplifier 206. The ratio of the 120K resistor with the selected T-network by closure of one of the switches S0 through S3 is designed to provide nominal gains of 0.1, 1, 10, or 100. In the preferred embodiment of FIG. 2, the actual gains are less than those values by a small quantity in order to insure that the saturation voltage 10 volts in the full wave rectifier 96 is not exceeded. The deficiency in gain of the scaler 95 is compensated for by the added gain of amplifier 109 in FIG. 3. Accordingly, the product of the gains in scaler 95 and amplifier 109 are the values 0.1, 1, 10 and 100 as a function of whether contacts S3, S2, S1, S0 are closed, respectively. The signal, with the program selected gain from amplifier 206, is connected through the voltage follower amplifier 207 and is input to the full wave rectifier 96. Amplifier 206 operates to invert the polarity of the input signal on line 40.

The full wave rectifier 96 is a conventional device. The rectifier 96 has unity gain. Rectifier 96 operates in a conventional manner and can be essentially ignored for capacitance measurements provided the inputs to peak detector 97 are otherwise assured as being unipolar.

In the AC mode, the output from the full wave rectifier 96 on line 103 is input to the peak detector 97. Peak detector 97 functions for positive input voltages to produce a DC output level on line 71 equal to the maximum peak input on line 103 measured relative to zero volts. The peak detector is reset to zero by the presence of a 1 on the PD RESET line from control unit 208 (see FIG. 10 of the cross-referenced application). Peak detector 97 is a conventional device and in one preferred embodiment is the Burr Brown model 4084/25 Peak Detector. The output from detector 97 on line 71 is selected by the AC signal input to the selector circuit 98 to provide the output on line 105 in the manner previously described in connection with FIG. 1.

In FIG. 3, the amplifier 109, the analog divider 99, the selection circuitry 101 and the analog-to-digital converter are shown in further detail.

The amplifier 109 receives the signal on line 105 and amplifies it to provide the peak detected signal, Vp, on line 108. The peak detected signal has an amplitude which is a DC level representing the peak to peak excursion of the capacitor measurement signal, Vc, on line 40 as multiplied by factors of 10 between 0.1 and 100. Amplifier 109 is a conventional device and in the preferred embodiment of FIG. 3 has a gain of approximately 1.2.

The peak detected voltage, Vp, is input to the analog divider 99. The analog divider 99 includes a conventional analog divider 212 which in a preferred embodiment is the Burr Brown model 4290. Divider 212 is appropriately biased to provide an output signal on line 79 which is equal to 10 times the input value on input N divided by the input value on input D. Accordingly, the transfer function of analog divider 99 from the input on line 108 to the output on line 79 is (10N)/D.

The N input to divider 212 is derived from a voltage divider network 213 which connects through selectable contacts A and B to the divider 212. In a preferred embodiment, contacts A and B are unused portions of the selection circuit 101. The B input is selected under control of the C TEST signal and the A contact is selected under control of the C TEST* signal. The B contact when closed provides a 0.2 volt signal to the N input of divider 212 whenever the C TEST signal is 1. Whenever the C TEST signal is 1, the A contact connects a 0.1 volt signal to the N input of divider 212. For the present invention, the 0.2 volt signal is always employed.

For the capacitance test of the present invention, the analog divider 99 provides on the output 79 a signal equal to $2/(Vp)$ where $Vp$ is the input on line 108 from the amplifier 109.

Also for the capacitance test, the SHORT signal selects the D contact in the selection circuit 101 to provide the $Vd$ signal on line 107 as the input to the analog-to-digital converter 102. The analog-to-digital converter 102 is a conventional device which in a preferred embodiment is a Function Modules, Inc. converter model number 105-BCD-P.

The polarity detector 125 is a conventional device not employed in the capacitance test of the present invention.

THEORY OF OPERATION

In FIG. 1, the excitation voltage, Vex, output on line 39 from the exciter circuit 19 is defined as follows:

$$Vex = A \sin \omega t \qquad \text{Eq. (1)}$$

With the computing circuit 20 interconnected as shown with the C1 capacitor 210 connected between the input and output of the computing amplifier 93, the current, $i$, through the W resistor 92 into the summing junction is given as follows:

$$i = (Vex)/R \qquad \text{Eq. (2)}$$

In Eq. (2), R is the value of the W resistor 92. By substituting a value of Vex from Eq. (1) into Eq. (2), the current into the summing junction is given as follows:

$$i = (A/R) \sin \omega t \qquad \text{Eq. (3)}$$

Since the computing circuit 20 and the capacitor under test 210 are connected as an integrator, the output, Vc, across the capacitor and output from the amplifier 93 on line 40 is given as follows:

$$Vc = -(1/C) \int_{ta}^{tb} i \, dt \qquad \text{Eq. (4)}$$

In Eq. (4), C is the value of the capacitor 210 under test, $i$ is the current into the summing junction, $dt$ is the time variable of integration, $ta$ is the zero crossing time when input current in initiated and integration begins, and $tb$ is the time at which integration effectively ends. The valuation of $ta$ and $tb$ will be described hereinafter.

The value of $i$ from Eq. (3) is substituted into Eq. (4) as follows:

$$Vc = -(1/C) \int_{ta}^{tb} (A/R) \sin \omega t \, dt \qquad \text{Eq. (5)}$$

The signal of Eq. (5) essentially appears on the output line 40 from the computing circuit 20. The signal Vc on line 40 is peak detected and multiplied by a proportionality constant, $-P$, to provide the peak detected signal, Vp, on line 108 as follows:

$$Vp = |(=Vc)(-P)| \qquad \text{Eq. (6)}$$

In Eq. (6), the integration is performed utilizing the value of Vc to produce the results as follows:

$$Vp = [A/(WRC)] \, [-\cos \omega t \, \Big|_{ta}^{tb} + K] \, [P] \qquad \text{Eq. (7)}$$

In Eq. (7), the value of K is equal to zero. The value of K is zero since it represents the initial charge across the capacitor 210 in FIG. 1. The charge across the capacitor 210 is held to zero by the closed contact K7 prior to the measurement time which starts at $ta$. In Eq. (7), the value of the lower limit of integration, $ta$, is equal to zero. The $ta$ time is commenced when the zero detector 89 in the exciter circuit 19 of FIG. 1 detects a zero crossing of the excitation signal on line 94. At that zero crossing time, inhibitor circuit 86 inputs a signal to the multiplier 87 which appears as the excitation signal on line 39. The upper unit of integration, $tb$, is effectively $\pi/\omega$ as a result of the operation of the peak detector 97. The nature of the peak detector 97 is to detect and output the highest value input received regardless of whether the input on line 103 thereafter falls to a lower value. For a sine wave integrated as indicated in Eq. (5), the peak value of integration occurs when the argument, $\omega t$, reaches $\pi$, that is, when t reaches $\pi/\omega$. Accordingly, the maximum output from the peak detector 71 occurs when tb in Eq. (7) equals $\pi/\omega$. Evaluating Eq. (7) at the lower and upper limits of zero and $\pi/\omega$ produces a result as follows:

$$Vp = [A/(\omega RC)][-\cos \pi + \cos 0] \, [P] \qquad \text{Eq. (8)}$$

Eq. (8) can be simplified as follows:

$$Vp = (2A)/(\omega RC)(P) = 2[(AP)/(\omega R)][1/C] \qquad \text{Eq. (9)}$$

In Eq. (9), the value $(AP)/(\omega R)$ is equal to the nominal value, Cn, of the capacitor under test 210. Accordingly, the nominal value, Cn, of the capacitor under test is defined as follows:

$$Cn = (AP)/(\omega R) \qquad \text{Eq. (10)}$$

In Eq. (1), A is the amplitude of the excitation signal, P is the proportionality factor determined principally by the scaler 95, $\omega$ is the frequency of the excitation signal, and R is the value of the resistor 92. Those values together are selected to provide a constant which is the nominal value, Cn, of the capacitor under test. Using Eq. (10) in the Eq. (9) produces the peak detected output, Vp, on line 108 as follows:

$$Vp = (2\,Cn)/C \qquad \text{Eq. (11)}$$

(11) indicates that the peak detected voltage Vp is equal to twice the ratio of the nominal value, Cn, divided by the measured value, C. The peak detected value of Eq. (11) is input to the analog divider circuit 99. Recalling that the divider 99 has a transformation ratio of 2/(Vp) indicates that the divided voltage output, Vd, on line 79 from divider 99 is given as follows:

$$Vd = C/Cn \qquad \text{Eq. (12)}$$

APPARATUS OPERATION

Referring to FIG. 4, the timing and measurement signals representative of the operation of the present invention are shown. The MEAS TRIG signal from the control unit 208 of FIG. 1 (see processor 6 of FIG. 1 in the cross-referenced application) produces a pulse at $t0$ to initiate the timing sequence. Approximately 2 milli-seconds later at 1, the SQUELCH* signal is switched from 0 to 1 (see FIG. 7, single-shot 129 and flip-flop 130 of the cross-referenced application). With the SQUELCH* signal 1, the contact K7 in FIG. 1 is open thereby removing the short circuit across the C1 capacitor 210. At $t0$ the MEAS TRIG signal causes the PD RESET signal to go from 0 to 1 for approximately 3 milli-seconds (see FIG. 10, flip-flop 163 in the cross-referenced application). When an AC test is being performed as in the present invention, the PD RESET signal from control unit 208 is followed by a SYN GATE signal at $t2$ (see FIG. 6, gate 118 and optical isolator 120 in the cross-referenced application).

After the SYN GATE signal has been generated as 1 by control unit 208 at $t2$, the excitation flip-flop 90 is no longer held in a reset state and flip-flop 90 is ready to be clocked to 1 on its Q output when a signal is received from the zero detect circuit 89. The zero detect circuit 89 detects a positive-going zero crossing in the signal on line 94 at time $t3$ so that at $t3$ the Q output, EXC-Q, from flip-flop 90 goes from 0 to 1. At the same time, the exciter circuit 19 provides on its output line 39 the excitation signal, Vex. In FIG. 4, the Vex signal has zero crossings at $t3$, $t4$, $t5$, $t6$, $t7$ and $t8$.

The computing circuit 20 responsively integrates the Vex signal as represented by the waveform Vc in FIG. 4. Note that the integrated output Vc is initially zero at $t3$ and is a maximum $\pi$ radians later at $t4$.

After $t4$, the voltage across the capacitor, Vc, is reduced since thhe excitation voltage between $t4$ and $t5$ is of the opposite polarity (negative) than what it was between $t3$ and $t4$ (positive). Note that the voltage swing of the voltage Vc is entirely on the negative side of the zero axis and is tangent to it. The one-sided negative nature of the Vc voltage results because the input to the capacitor was started at a positive-going zero crossing of the excitation signal. The tangent nature of the Vc waveform results the squelching operation of contact K7 which insures that no initial charge exists across the capacitor 210 coupled with the zero-crossing start.

The output, Vp, from the peak detector as it appears on line 108 of FIG. 1 typically has some initial value at $t0$ resulting from a previous measurement. The operation of the PD RESET signal over the period from $t0$ to $t2$ causes the waveform Vp to be returned to zero long prior to time $t2$. At time $t2$, the peak detector 97 is ready to receive an appropriately scaled input and to responsively produce an output on line 108 remains at zero until after the zero-crossing time $t3$. At time $t3$, peak detector 97 commences to sense the increasing input in response to the raising Vc waveform. At $t4$, the Vc waveform has reached its maximum value and hence the waveform Vp reaches its maximum value, $+(2Cn)/C$, as explained in connection with Eq. (11) above.

The analog divider output, Vd has a waveform which follows the reciprocal of the Vp waveform. Specifically, at t0, the Vd waveform has a value typically representing some previous measurement. As Vp is returned to zero, the Vd waveform goes into saturation prior to t2 and until t3 when Vp has a value greater than zero. During the transition from t3 until t4, Vd follows the Eq. (12) relationship. After t4, Vd is at its minimum value, +C/Cn, as discussed in connection with Eq. (12) above.

At any time after t4, the output from divider 99 is available for analog-to-digital conversion in the converter 102 of FIG. 1. Specifically at t6+ time, the ADC START signal provides a pulse from control unit 208 which commences the conversion. The ADC START pulse occurs a sufficient period after t2 to insure that at least one-half cycle of the excitation signal Vex has occurred. In the preferred embodiment of the cross-reference application, t6+ occurs 2 milli-seconds after t2 in the case where Vex has a $10^4$ radian frequency or occurs 15 milli-seconds after t2 in the case where Vex has a $10^3$ radian frequency. The time when the ADC START pulse occurs is determined by the control unit 208 (see FIG. 10, single-shots 164 and 165 and flip-flop 169 of the cross-referenced application).

At the beginning of the ADC START signal at t9, the ADC COMP* signal is switched to 1 by the analog-to-digital converter 102. The ADC COMP* signal remains 1 until the conversion is complete which occurs in approximately 0.75 milliseconds at t10 when it returns to 0. The ADC COMP* signal is connected to the control unit 208 for indicating that the apparatus of FIG. 1 is available for making a new measurement (see FIG. 10, flip-flop 167 of the cross-referenced application).

A specific example of the operation of the present invention is given in connection with the following TABLE I. In TABLE I, the nominal value, Cn, is selected to be ten microfarads. TABLE I indicates the values of Vc, Vp, Vd, and the digital output (DIGITAL) when the actual value, C, is 25 microfarads, 12.5 microfarads, 10 microfarads, 8.6 microfarads and 2 microfarads.

TABLE I

| Cn  | C    | Vc    | Vp    | Vd    | DIGITAL |
|-----|------|-------|-------|-------|---------|
| 10. | 25.0 | −0.8  | +0.8  | +2.50 | 0250    |
| 10. | 12.5 | −1.6  | +1.6  | +1.25 | 0125    |
| 10. | 10.0 | −2.0  | +2.0  | +1.00 | 0100    |
| 10. | 8.6  | −2.3  | +2.3  | +0.86 | 0086    |
| 10. | 2.0  | −10.0 | +10.0 | +0.20 | 0020    |

While one preferred embodiment of the present invention is employed in connection with the programmable tester of the cross-referenced application, the invention also includes other testers and manual testing methods. When the programmed operation of the cross-referenced application is employed, the sub-routine which correlates with a capacitance test appears as Step S31 in TABLE II of the cross-referenced application as follows:

(99C(010180(20080&(19"C"(98N:$*

While a preferred embodiment of the present invention employs a computing circuit in an integrating configuration, the invention also applies to utilizing a differentiating circuit by reversing the location of the capacitor under test and the W resistor. A differentiating configuration is achieved for the measurement unit of the present invention by employing the configurable measurement unit in the cross-referenced application when it is configured in the Y mode. The Y mode is described therein in connection with FIG. 13 which description is hereby incorporated by reference in the present application. In the Y mode, the analog divider circuit 99 is bypassed and the signal on line 108 is input directly to the A-to-D converter. When a differentiating configuration is employed, the signal output from the differentiating computing circuit is directly proportional to the capacitance under test. For a time varying excitation of the form $A \sin \omega t$, the output from the computing circuit is of the form $A\omega RC \cos \omega t$ where R is the resistor in the feedback loop. The quantity $A\omega R$ and a proportionality constant P (supplied by scaler 95) can be selected to be equal to the reciprocal of a nominal value, Cn, of capacitance. With this selection the peak detector output is C/Cn. In the case of a differentiator circuit, the initial charge across the capacitor and the zero-crossing of the excitation signal are unimportant. Also, the full-wave rectifier 96 of FIG. 1 can be replaced by a half-wave rectifier if desired.

Although a preferred embodiment of the invention employs a sinusoidal excitation signal, other forms of time-varying signals may be employed. For example, in the integrating configuration of the preferred embodiment, the excitation source may employ a unipolar pulse which imparts a known charge across the capacitor as a function of the value of the capacitor.

While in the preferred embodiment, the initial charge across the capacitor under test is held to a zero value by closure of the K7 contact, the requirement of the integrating configuration of the preferred embodiment is merely that the initial charge be known and not necessarily that it be zero. If a known, non-zero charge is employed across the capacitor, then the measurement value attributable to the initial known charge is thereafter subtracted from the measurement signal. For example, amplifier 109 can be biased with a value which compensates for a known initial charge across the capacitor thereby subtracting from the measurement signal a quantity attributable to the initial charge.

Although a preferred embodiment of the present invention employs a zero-crossing detector for initiating the excitation signal in order to insure that the output from the computing circuit will be tangent to the zero axis, the present invention can be employed when the output is not tangent to the zero axis and when the output is on both sides of or on one side of the zero axis. In such a case, one or more peak detectors are employed to sense the excursion above the zero axis and the excursion below the zero axis with means for algebraically summing those quantities.

While the invention has been particularly shown and described with reference to preferred embodiments thereof, it will be understood by those skilled in the art that the foregoing and other changes in form and details may be made therein without departing from the spirit and scope of the invention.

I claim:

1. An apparatus for measuring the capacitance of a capacitor under test comprising:
   exciter circuit means for providing a time-varying excitation signal,
   computing circuit means including an amplifier having a summing junction connected to the capacitor under test, said computing circuit means responsive to said excitation signal for producing a measurement signal as a function of the capacitance of said capacitor, peak detector means for peak detecting said measurement signal to provide a measurement of the capacitance of said capacitor.

2. An apparatus for measuring the capacitance of a capacitor under test comprising, exciter circuit means for providing a time-varying excitation signal, computing circuit means including an amplifier having an input summing junction and an output, including an input resistor connected to said summing junction, and including means for connecting the capacitor under test between said summing junction and said output whereby said computing circuit means integrates the excitation signal to form a measurement signal, peak detector means connected to peak detect said measurement signal to form a peak detected signal having a magnitude proportional to the capacitance of said capacitor under test.

3. The apparatus of claim 2 wherein said exciter circuit means includes means for initiating said excitation signal at a zero crossing.

4. The apparatus of claim 2 wherein said exciter circuit means includes means for providing said excitation signal as a sinusoidal signal and means for initiating said excitation signal at a zero crossing of said sinusoidal signal.

5. The apparatus of claim 2 including means for selectively shunting said capacitor under test prior to initiating said excitation signal.

6. The apparatus of claim 2 wherein said exciter circuit means includes for providing a sinusoidal signal, inhibit means for selectively inhibiting said sinusoidal signal, zero detector means for providing a zero-detect signal at zero crossings of said sinusoidal signal, a flip-flop having an output connected to control said inhibit means, said flip-flop connected to receive said zero-detect signal whereby said flip-flop is switched to allow said inhibit means to pass said sinusoidal signal and initiate said excitation signal at a zero crossing of said sinusoidal signal.

7. The apparatus of claim 2 including digitally controllable means for selecting the amplitude of the excitation signal.

8. The apparatus of claim 2 including reciprocal circuit means for forming the reciprocal of said peak detected signal to provide a reciprocal signal having a magnitude directly proportional to the capacitance of said capacitor under test.

9. The apparatus of claim 2 wherein the capacitance of said capacitor is C, wherein said resistor has a resistance of R, wherein said excitation signal is a sinusoid having an amplitude of A and a frequency of $\omega$, and wherein said apparatus includes scaler means for providing a proportionality constant P whereby the quantity $AP/\omega R$ is equal to a preselected nominal value, $Cn$, of the capacitor under test and the magnitude of said peak detected signal is directly proportional to $Cn/C$.

10. The apparatus of claim 9 including reciprocal circuit means for forming the reciprocal of said peak detected signal proportional to $Cn/C$ to provide a reciprocal signal directly proportional to $C/Cn$.

11. The apparatus of claim 9 including an analog-to-digital converter for converting said reciprocal signal to a digital value.

12. The apparatus of claim 2 including means for resetting said peak detector means and means for initiating said excitation signal to commence a capacitance measurement.

13. A method for measuring the capacitance of a capacitor under test comprising the steps of:

generating a time-varying excitation signal, applying said excitation signal to the summing junction of an amplifier connected to the capacitor under test to provide a measurement signal having an amplitude proportional to the capacitance of said capacitor under test, peak detecting said measurement signal to provide a measurement of the capacitance of said capacitor under test.

14. A method for measuring the capacitance of a capacitor under test comprising the steps of:

generating a time-varying excitation signal, integrating said excitation signal with a computing circuit formed by a resistor and the capacitor under test connected to the summing junction of amplifier to form a measurement signal, peak detecting said measurement signal to form a peak detected signal having a magnitude proportional to the capacitance of said capacitor under test.

* * * * *